United States Patent [19]

Siegel et al.

[11] 4,413,260

[45] Nov. 1, 1983

[54] REMOTE-CONTROL SYSTEM FOR COIN-OPERATED PHONOGRAPHS

[75] Inventors: Lawrence Siegel, Chicago; Edward L. Polanek, Woodstock; Anthony J. Miller, Skokie; Alan L. Woodman, Mount Prospect, all of Ill.

[73] Assignee: Stern Electronics, Inc., Elk Grove Village, Ill.

[21] Appl. No.: 297,990

[22] Filed: Aug. 31, 1981

[51] Int. Cl.³ .......................... H04Q 9/00; H04B 1/32
[52] U.S. Cl. ................................. 340/825.25; 194/15; 340/825.64
[58] Field of Search ...................... 340/825.25, 825.72, 340/825.64, 168 B, 168 R; 455/151; 194/15

[56] References Cited

U.S. PATENT DOCUMENTS

| | | | |
|---|---|---|---|
| 4,056,808 | 11/1977 | Benhamou | 451/151 |
| 4,127,876 | 11/1978 | Schwartz | 455/151 |
| 4,228,402 | 10/1980 | Plummer | 340/825.25 |

FOREIGN PATENT DOCUMENTS

| | | | |
|---|---|---|---|
| 2746532 | 4/1979 | Fed. Rep. of Germany | 455/151 |
| 2746552 | 4/1979 | Fed. Rep. of Germany | 455/151 |
| 2939589 | 4/1981 | Fed. Rep. of Germany | 340/825.25 |

*Primary Examiner*—Donald J. Yusko
*Attorney, Agent, or Firm*—George H. Gerstman

[57] ABSTRACT

A coin-operated phonograph in which certain functions are remotely controlled. A transmitter is provided for transmitting a number of modulated carrier signals, including an up volume signal and a down volume signal. The phonograph carries a multi-channel receiver that is adapted for receiving the carrier signals transmitted by the transmitter. A detector is connected to the receiver for detecting the modulated carrier signals. An amplifier with gain control is provided and is controlled in accordance with receipt of the modulated carrier signals. A manually-operable volume control switch is carried by the phonograph and may be used instead of the transmitter to control the gain of the amplifier.

3 Claims, 2 Drawing Figures

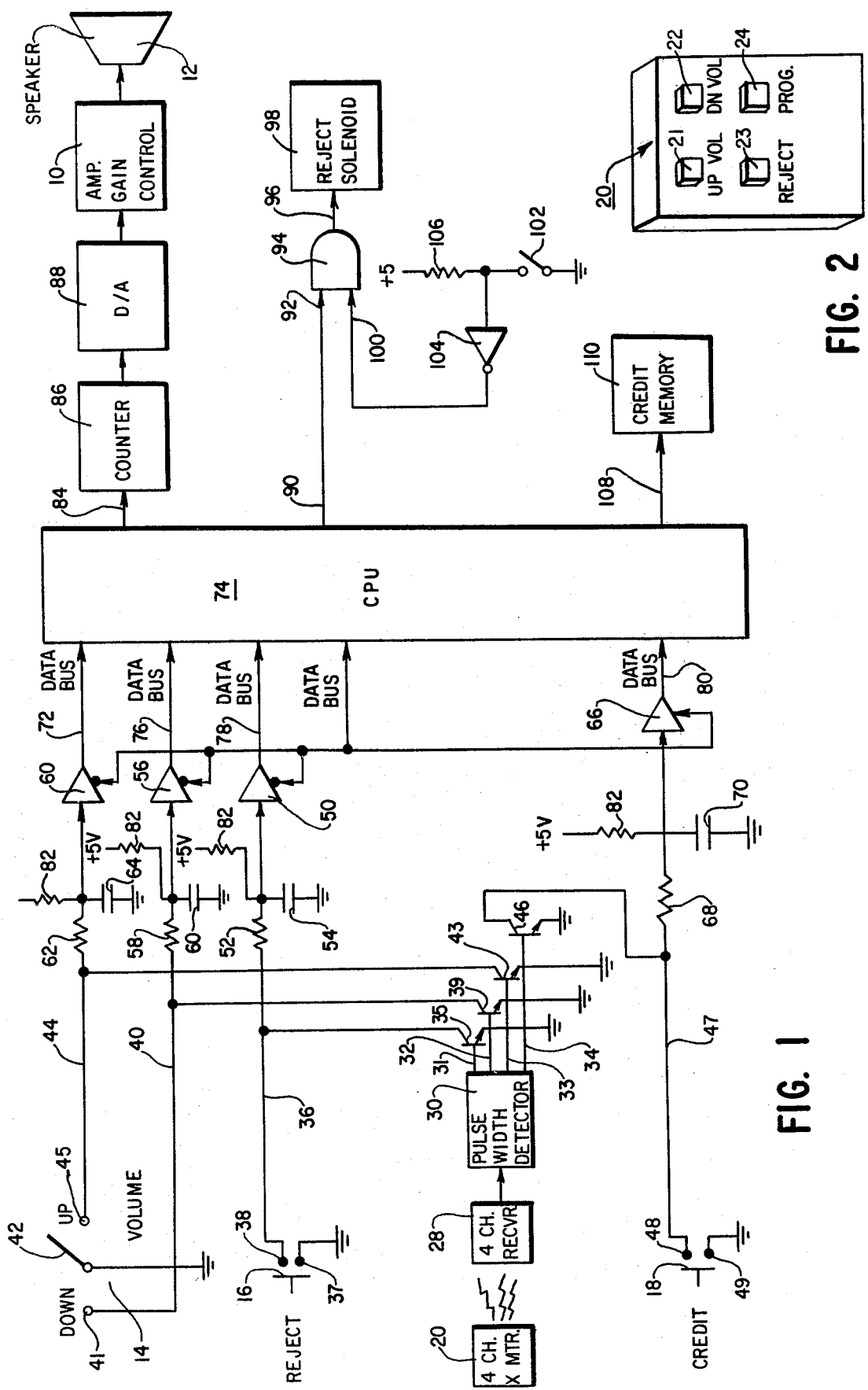

REMOTE-CONTROL SYSTEM FOR COIN-OPERATED PHONOGRAPHS

FIELD OF THE INVENTION

The present invention concerns a novel phonograph, and, in particular, the illustrative embodiment of the present invention concerns a coin-operated phonograph that is both manually controlled at the phonograph and remotely controlled.

BACKGROUND OF THE INVENTION

Coin-operated phonographs, of the type which are typically located in restaurants, conventionally carry a volume switch in the form of a potentiometer for varying the gain of the sound amplifier. Coin-operated phonographs also conventionally carry a reject button for rejecting a particular sound recording while it is being played.

It is an object of the present invention to provide a wireless, remote-control system for phonographs, particularly coin-operated phonographs.

A further object of the present invention is to provide a wireless, remote-control system for phonographs which enables remote control of several parameters, including up volume, down volume and reject.

Another object of the present invention is to provide a wireless, remote-control system for phonographs which operates on digital electronics principles and may be constructed on a circuit board system that is easily mountable into a phonograph.

A further object of the present invention is to provide a wireless, remote-control system for phonographs which is relatively simple in operation and efficient to manufacture.

Other objects and advantages of the present invention will become apparent as the description proceeds.

SUMMARY OF THE INVENTION

In accordance with the present invention, a remote-controlled phonograph is provided which comprises an up volume line and a down volume line. A multi-channel receiver is provided and is adapted for receiving modulated carrier signals. Detector means are connected to the receiver for detecting modulated carrier signals. A transmitter is provided for transmitting a plurality of modulated carrier signals, including an up volume signal and a down volume signal.

An up volume switch couples the detector means to the up volume line and a down volume switch couples the detector means to the down volume line. The up volume switch and the down volume switch each are operable in response to receipt of, respectively, an up volume signal and a down volume signal detected by the detector means.

An amplifier with gain control is provided. Volume control means couple the up volume switch and the down volume switch to the amplifier to vary the gain of the amplifier in response to receipt of the up volume signals or down volume signals.

In the illustrative embodiment, a manually-operable volume control switch is carried by the phonograph and is connected to the up volume line and the down volume line.

In the illustrative embodiment, the multi-channel receiver includes four channels corresponding to four different modulated carrier signals, representing four parameters from the group consisting of lower volume, higher volume, reject, credit, mute and power off/on.

In the illustrative embodiment, the modulated carrier signal comprises a pulse-width modulated carrier signal and the detector means comprises a pulse-width detector. The volume switches each comprise a grounded emitter transistor for each modulated carrier signal. The volume control means comprises gating means coupling both the volume switches and the manually-operable volume control switch to the amplifier.

In the illustrative embodiment, the volume control means further includes a plurality of data busses. An enable signal is provided for the gating means thereby enabling a data signal to pass. The amplifier gain is variable in response to the data signals. The enable signals are provided by a microprocessor which is operable to poll a plurality of inputs thereto.

In the illustrative embodiment, the volume control means includes a counter and a digital to analog converter coupled to the output of the counter. Means are provided for incrementing the counter in response to operation of the volume up switch and means are provided for decrementing the counter in response to operation of the volume down switch.

A more detailed explanation of the invention is provided in the following description and claims, and is illustrated in the accompanying drawings.

BRIEF DESCRIPTION OF THE DRAWINGS

FIG. 1 is a schematic circuit diagram of a wireless, remote-controlled phonograph constructed in accordance with the principles of the present invention; and FIG. 2 is an illustration of a transmitter constructed in accordance with the principles of the present invention.

DETAILED DESCRIPTION OF THE ILLUSTRATIVE EMBODIMENT

The illustrative embodiment concerns a coin-operated phonograph, although it is understood that the present invention is applicable to phonographs which are not coin-operated. Referring to FIG. 1, the phonograph contains an amplifier 10 with gain control and a speaker 12. The phonograph carries a volume switch 14, a reject button 16 and a credit button 18 is located in a hidden, relatively non-accessible portion of the phonograph. A separate transmitter 20 is provided which is a hand-held or wall-mountable package that is preferably powered by a nine volt radio battery.

As illustrated in FIG. 2, the transmitter may contain a volume up push button 21, a volume down push button 22, a reject record push button 23 and a serviceman programmable push button 24. The serviceman programmable push button 24 may be adapted to an audio mute function, a free play credit entry function or a power on/off function for the phonograph system.

The system operates by means of a digitally modulated radio carrier that is transmitted by pressing one of the buttons 21-24 on the transmitter. Each of the four channels transmits a pulse-width modulated carrier at approximately 305 megahertz to a four channel receiver 28. Since each channel is a different code, only one button 21-24 may be operated at a time.

Each channel of both the transmiter 20 and the receiver 28 is set to its matching code by means of an eight position D.I.P. switch contained within each unit. The codes can easily be changed in the field if necessary. A selection of 64 codes per channel is possible. The coding technique includes a serial eight bit pulse-width modulated carrier pulsed at a bit rate of 250 bits per second.

At the output of four channel receiver 28 there is a pulse-width detector 30, having four output lines 31, 32, 33 and 34, corresponding to the four channels of the system. Output channel line 31 is coupled to the base of a grounded emitter NPN transistor 35 which acts as an open collector switch. The collector of transistor 35 is connected to reject line 36 which extends to contacts 37 and 38 of reject switch 16.

Pulse-width detector output line 32 is connected to the base of grounded emitter NPN transistor 39, the collector of which is connected to down volume line 40. Also connected to down volume line 40 is down contact 41 which is contacted by arm 42 of switch 14 when a decrease of volume is desired and the operator wishes to adjust the volume down directly at the phonograph and not using the remote transmitter.

Pulse-width detector output line 33 is connected to the base of grounded emitter NPN transistor 43, the collector of which is connected to up volume line 44. Contact 45 of switch 14 is also connected to up volume line 44.

The output line 34 of pulse-width detector 30 is connected to the base of a grounded emitter NPN transistor 46, the collector of which is connected to credit line 47. It is to be understood that credit line 47 could be an audio mute line or a power on/off line if desired. Contacts 48 and 49 of credit switch 18 are connected to credit line 47 so that when the credit push button 18 is pressed, contacts 48 and 49 will be closed to provide a signal on the credit line 47.

Transistor 35 is connected to a tri-state gate 50 through a current limiting resistor 52 which, with capacitor 54 in parallel therewith, acts as a low pass filter. Similarly, transistor 39 is connected to a tri-state gate 56 through current limiting resistor 58, which combined with parallel capacitor 60, acts as a low pass filter. Similarly, transistor 43 is connected to a tri-state gate 60 through current limiting register 62 and parallel capacitor 64, and transistor 46 is connected to tri-state gate 66 through current limiting resistor 68 and parallel connected capacitor 70.

The output of up volume line 44 is connected through data bus 72 to a microprocessor 74. The output of down volume line 40 is connected through a data bus 76 to microprocessor 74. The output of reject line 36 is connected through data bus 78 to microprocessor 74. The output of credit line 47 is connected through data bus 80 to microprocessor 74. Microprocessor 74 is programmed to provide an enable signal to turn on tri-state gates 60, 56, 50 and 66 to thereby pass data from the input of each gate to its output. In this manner, microprocessor 74 is permitted to read the information from the receiver circuitry.

Microprocessor 74 is constantly polling the various inputs. It polls the volume control many times per second and provides an enable signal during the period of time polled. When the enable signal is provided, then the signal can be fed to the data bus that the volume should go up or down. If there is no enable signal, the system is ineffective to make any change.

It can be seen that at the input side of each tri-state gate, there is a pull-up resistor 82 for establishing the off logic voltage.

An output 84 of microprocessor 74 is connected to a digital up-down counter 86, the output of which is connected to a digital to analog converter 88, the output of which is coupled to the gain control circuit of amplifier 10. An output 90 of the microprocessor is coupled to an input 92 of AND gate 94. The output 96 of AND gate 94 is coupled to a reject solenoid 98. The other input 100 of AND gate 94 is from a sensing switch on the mechanism which is closed when the mechanism is in play. In this manner, the reject mechanism can operate only when the record is being played. Thus a switch 102 is coupled to an inverter 104 to input 100 of AND gate 94 and a pull-up resistor 106 is utilized for providing the off-level voltage. Switch 102 is closed only when a record is being played, and in this manner the reject solenoid 98 cannot operate unless a record is being played.

An output 108 of microprocessor 74 is connected to a credit memory 110, such as a RAM.

In the operation of the system, if one wishes to vary the volume of the phonograph without using the remote-controlled transmitter, switch arm 42 is manually operated to engage switch contact 41. Each engagement of arm 42 with contact 41 will provide a pulse so that microprocessor 74 will decrement the counter to reduce the output voltage of digital to analog converter 88 which will operate to reduce the gain of the amplifier 10. Each time switch arm 42 engages contact 41, the counter will be decremented further to reduce the volume further. Likewise, when switch arm 42 engages contact 45, a pulse will be provided so that microprocessor 74 will increment the counter to increase the output voltage of digital to analog converter 88, thereby increasing the gain of amplifier 10.

If the remote-control system is utilized, to decrease the volume, down volume button 22 is pressed, thereby transmitting a coded signal to the down volume channel of four channel receiver 28. The pulse-width coded signal is detected by pulse-width detector 30 and a signal will be provided on output line 32, to operate transistor 39 thereby signaling down volume line 40. In response thereto, microprocessor 74 will provide a signal on line 84 to decrement the counter in the manner described above.

In a similar manner, if an increase in volume is desired, up volume button 21 is pressed to transmit a signal, resulting in a signal on output line 33 of pulse-width detector 30, thereby operating switch 43 to provide the appropriate signal on up volume line 44. When tri-state gate 26 is enabled and microprocessor 74 reads the up volume signal on up volume line 44, counter 86 will be incremented to increase the voltage signals from converter 88 to increase the gain of amplifier 10.

Reject switch 23 of transmitter 20 operates in the same manner to provide an output signal on detector output line 31, thereby operating switch 35, with data bus 78 providing information to the microprocessor so that an output signal on line 90 by the microprocessor will be provided to operate the reject solenoid through AND gate 94.

It can be seen that data bus 72 is responsive to a signal on up volume line 44, data bus 76 is responsive to a signal on down volume line 40, data bus line 78 is responsive to a signal on reject line 36 and data bus line 80 is responsive to a signal on credit line 47. These data busses are polled by the microprocessor and when the appropriate signal is found, the microprocessor will provide appropriate output signals (a) on line 84 if either data bus 72 or data bus 76 has an on signal, (b) on line 90 if data bus 78 has an on signal, and (c) on line 108 if data bus 80 has an on signal.

It can be seen that a system has been provided in which a phonograph can be controlled remotely utilizing digital techniques and a plurality of modulated carrier signals, each of which corresponds to a different control function. Although an illustrative embodiment of the invention has been shown and described, it is to be understood that various modifications and substitutions may be made by those skilled in the art without departing from the novel spirit and scope of the invention.

Although no limitation is intended, the present invention may be used with the coin-operated phonograph disclosed in Siegel, Polanek, Miller and Woodman U.S. application Ser. No. 230,398, filed Feb. 21, 1981, entitled "Vending Machine", and assigned to Stern Electronics, Inc.

What is claimed is:

1. A remote-controlled phonograph which comprises:
    a volume control switch that is manually-operable;
    an amplifier with gain control;
    a multi-channel receiver adapted for receiving modulated carrier signals, said multi-channel receiver including one channel corresponding to a first modulated carrier signal representing lower volume and a second channel corresponding to a second modulated carrier signal representing higher volume, each of said modulated carrier signals comprising a pulse-width modulated carrier signal;
    detector means connected to said receiver for detecting said modulated carrier signals, said detector means comprising a pulse-width detector;
    a transmitter for transmitting a plurality of modulated carrier signals;
    switch means coupled to said detector means and operable in response to detection of predetermined modulated carrier signals, said switch means comprising a separate switch for each modulated carrier signal, each switch being operable to aid in controlling a selected parameter;
    volume control means coupling said switch means to said amplifier to vary the gain of said amplifier in response to operation of said switch means, said volume control means comprising gating means coupling both said switch means and said manually-operable volume control switch to said amplifier;
    said gating means comprising a separate gate for each modulated carrier signal; and means for providing an enable signal for each gate.

2. A remote-controlled phonograph as described in claim 1, said switch means comprising a grounded emitter transistor for each modulated carrier signal.

3. A remote-controlled phonograph as described in claim 1, said volume control means including a counter and a digital to analog converter coupled to the output of said counter; said switch means including a volume up switch and a volume down switch; means for incrementing said counter in response to operation of said volume up switch; means for decrementing said counter in response to operation of said volume down switch.

* * * * *